United States Patent [19]
Babin et al.

[11] Patent Number: 4,968,950
[45] Date of Patent: Nov. 6, 1990

[54] PLL FREQUENCY SYNTHESIZER OUTPUT CONTROL CIRCUIT

[75] Inventors: David C. Babin; Edward A. Kuligowski, both of Austin, Tex.

[73] Assignee: Motorola, Inc., Schaumburg, Ill.

[21] Appl. No.: 451,919

[22] Filed: Dec. 18, 1989

[51] Int. Cl.$^5$ ............................................. H03L 7/18
[52] U.S. Cl. .................................... 331/1 A; 331/11; 331/14; 331/25; 331/DIG. 2
[58] Field of Search ..................... 331/1 A, 11, 12, 14, 331/25, DIG. 2

[56] References Cited

U.S. PATENT DOCUMENTS 4,069,462  1/1978  Dunn ....................................... 331/11
4,868,513  9/1989  Piercy et al. ..................... 331/1 A X Primary Examiner—Siegfried H. Grimm

[57] ABSTRACT

A PLL frequency synthesizer IC chip having a sample frequency input terminal, data and address lines and a plurality of different output devices, and a mode control circuit for turning off any selected ones of the different output devices. The mode control circuit comprises a plurality of inputs connected to at least one of the data and address lines for determining different modes of operation, and a plurality of outputs connected to the plurality of different output devices for selecting ones of the plurality of different output devices to allow outputting therefrom and shutting off outputs from all of the remaining different output devices, based on the determined mode of operation.

4 Claims, 2 Drawing Sheets

PLL FREQUENCY SYNTHESIZER OUTPUT CONTROL CIRCUIT

FIELD OF THE INVENTION

The present invention relates, in general, to phase locked loops (PLLs). More specifically, the present invention relates to an IC chip PLL frequency synthesizr which has a plurality of outputs, any and all of which are turned off when not being used.

BACKGROUND OF THE INVENTION

The use of phase locked loops (PLLs) in the fields of cable television (CATV), TV tuning, AM/FM radios, scanning receivers, two way radios, amateur radios, etc. is well known. A typical PLL basically consists of a phase detector, a low-pass filter and a voltage controlled oscillator (VCO). These enumerated elements are coupled to form a closed-loop system. The phase detector measures differences in phase between a reference frequency and a feedback signal frequency from the VCO. Any detected differences generate an error signal which is filtered and supplied to the VCO. The VCO utilizes the error signal so as to minimize the frequency difference between the feedback signal and the reference signal.

A frequency synthesizer is usually made as an IC chip, and must have several output features in order that one generic version of the IC chip may meet or may be adapted to meet any application requirements. A user can select and use one or more desired outputs depending on the application. Howevr, because all output pins are always providing output signal values, unused output pins generate noise causing electromagnetic interference (EMI) and radio frequency interference (RFI) which badly affects other external circuit devices and other elements inside the IC chip.

In order to avoid such a noise problem, it is known to use wire bonding options in which unnecessary output pads in the IC chip are not bonded to pins. However, in this solution, the unnecessary output pads still provide their outputs and badly affect other elements in the IC chip. Another known technique is to use metallization options in which the unused output devices are not connected to pads or other elements in the IC chip. In this case, however, different masks must be prepared to produce different types of chips. In both cases, an IC chip is locked into a specifically configured package that only has the desired outputs, and such a specific IC chip cannot readily be used in a variety of applications. This seriously limits the use of the chip and requires that many different types of chips be made.

SUMMARY OF THE INVENTION

Accordingly, it is an object of the present invention to provide an improved PLL frequency synthesizer generic IC chip which can be used for many applications without EMI or RFI trouble.

More particularly, it is an object of the present invention to provide such a PLL frequency synthesizer IC chip which can turn on/off any selected ones of output devices.

These and other objects and advantages of the present invention are provided by a PLL frequency synthesizer IC chip having a sample frequency input terminal, data and address lines and a plurality of different output devices, and a mode control circuit for turning off any selected ones of the plurality of different output devices. The mode control circuit comprises a plurality of inputs connected to at least one of the data and address lines for determining different modes of operation, and a plurality of outputs connected to the plurality of different output devices for selecting ones of the plurality of different output devices to allow outputting therefrom and shutting off outputs from all of the remaining different output devices, based on the determined mode of operation.

In carrying out the above and other objects of the invention in one form, there is provided a PLL frequency synthesizer IC chip having a sample frequency input terminal, data and address lines and a plurality of different output devices and a mode control circuit for turning off any selected ones of the different output devices. The mode control circuit comprises a plurality of inputs connected to the plurality of different output devices for selecting ones of the plurality of different output devices to allow outputting therefrom and shutting off outputs from all of the remaining different output devices, based on the determined mode of operation. The IC chip is coupled to a voltage controlled oscillator through the sample frequency input terminal and further comprises a reference frequency counter for counting a reference frequency divided by a first number, a sample frequency counter coupled to the sample frequency input terminal for counting a sample frequency fed back from the voltage controlled oscillator divided by a second number, and a phase detecting circuit coupled to the reference frequency counter and the sample frequency counter for comparing the count of the divided reference frequency and the count of the divided sample frequency and providing an error signal based on the comparison.

These and other objects and advantages will be apparent to one of skill in the art from the detailed description below taken together with the drawings.

DETAILED DESCRIPTION OF THE INVENTION

Figure 1:
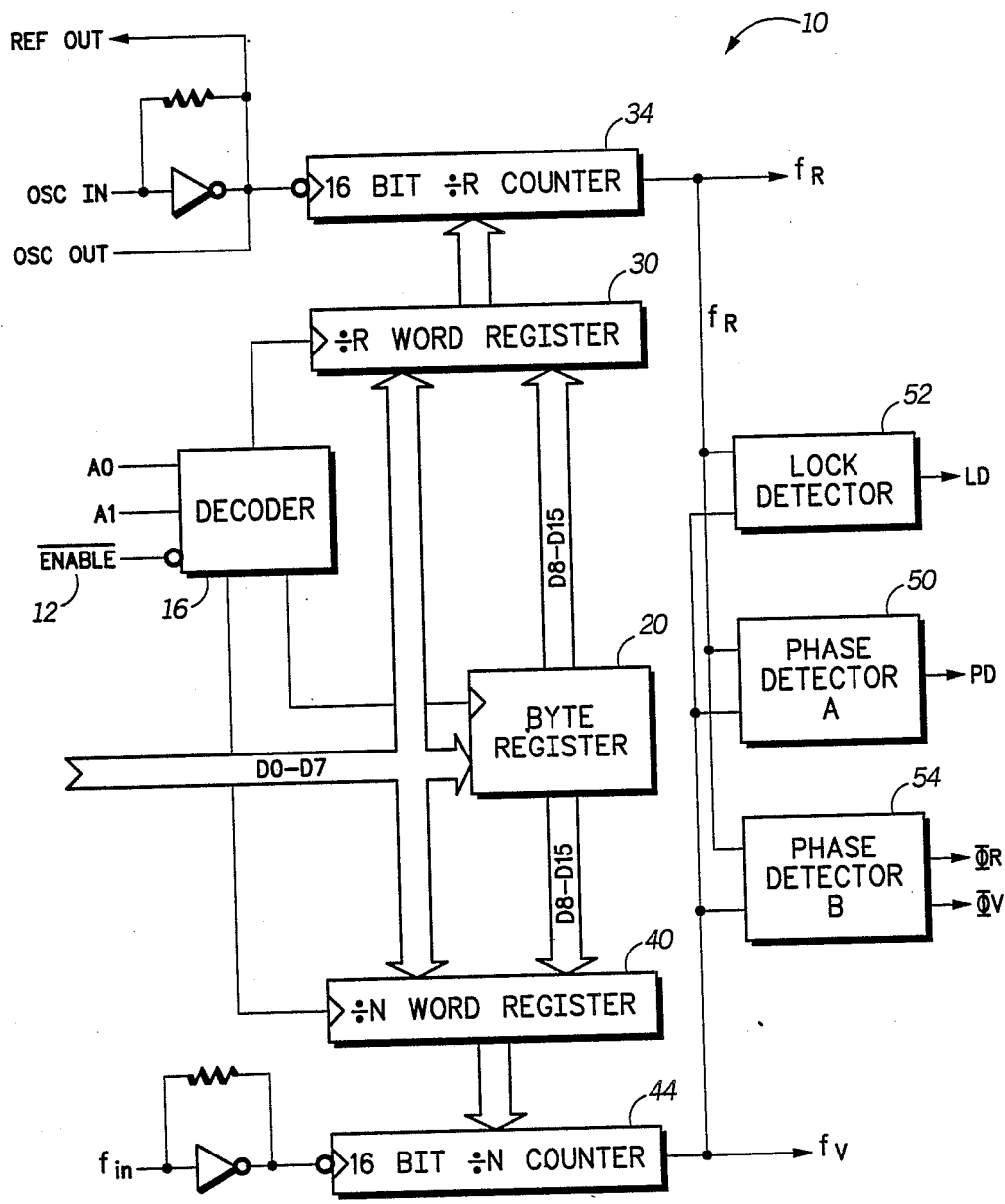
FIG. 1 is a block diagram of a prior PLL frequency synthesizer IC chip.

In order to facilitate understanding the present invention, a reference will be made to a conventional PLL frequency synthesizer IC chip. Referring to FIG. 1 a conventional parallel input PLL frequency synthesizer 10 is shown. This frequency synthesizer can be used with a loop filter and VCO to form a digital phase locked loop (DPLL). PLL frequency synthesizer 10 basically comprises a decoder 16, a byte register 20, a divide-by-R word register 30, a sixteen-bit divide-by-R counter 34, a divide-by-N word register 40, a sixteen-bit divide-by-N counter 44 and output devices 50, 52, 54. The numbers "R" and "N" may be assumed to be integers. Each of output devices 50, 52 and 54 has two frequency inputs. All components are supplied with a power voltage $V_{DD}$ (e.g. three to six volts supply range) by a power supply (not shown). PLL frequency synthesizer 10 is programmed by using an eight-bit data input (D0–D7), two-bit address lines (A0, A1) and an ENABLE line. Address information on A0 and A1 is used to define which register should receive the data on data input lines D0 through D7.

In operation, data is initially supplied to inputs D0 through D7 under control of a microcomputer or microprocessor. Then the data on D0 through D7 are loaded into byte register 20 by strobing ENABLE with A1=A0 and having a logic low value. In the illustrated form, input D7 is the most significant bit. Byte register 20 holds the information D0-D7 and outputs the data onto an internal data bus as bit lines D8-D15 for transferring the bits to the upper byte of word register 30 as explained later. The previous divide ratio in word register 30 remains unaffected at this point in time.

Next, new data is supplied to inputs D0 through D7 and transferred directly to the lower byte of R word register 30, with input D0 representing the LSB. By strobing with the ENABLE signal wherein A1=logic low and A0=logic high, the new eight-bit data on inputs D0-D7 and the previous eight-bit data on bit lines D8-D15 are loaded in parallel to the lower and upper bytes of divide-by-R word register 30, respectively. The entire sixteen bits of data are held in word register 30 for programming the division ratio R of sixteen-bit divide-by-R counter 34. In this particular implementation, the divisor R of counter 34 can be programmed with values ranging from 6 to 65,535. This permits the use of conventional and less expensive crystals with PLL frequency synthesizer 10.

The divide-by-R counter 34 receives a reference frequency through an OSC input terminal which is coupled to an external crystal oscillator. The reference frequency can be also used externally through a terminal labeled "REF OUT". The divide-by-R counter 34 counts the pulses of the buffered reference frequency, downward from its programmed divisor R to zero, and provides one output pulse (fR) at every R input pulses. Therefore, the frequency fR equals the reference frequency divided by R.

Commercially available temperature-compensated crystal oscillators (TXCOs) or crystal-controlled data clock oscillators provide very stable reference frequencies for the OSC input terminal. An oscillator capable of sinking and sourcing, for example, fifty microamperes at CMOS logic levels may be direct or DC coupled to the OSC input. In general, the highest frequency capability is obtained utilizing a direct-coupled square wave signal having a rail-to-rail ($V_{DD}$ to $V_{SS}$) voltage swing. If the oscillator does not have CMOS logic levels on the outputs, capacitive or AC coupling to the OSC input may be used. The OSC output, an unbuffered output, should be left floating.

An off-chip crystal oscillator may be designed by using ICs specifically developed for crystal oscillator applications, such as the MC12060, MC12061, MC12560, or MC12561 MECL devices which are commercially available from Motorola Inc. The reference signal from the MECL device is AC coupled to the OSC input. For large amplitude signals (standard CMOS logic levels), DC coupling is used. Again, the OSC output, an unbuffered output, should be left floating. An on-chip amplifier (a digital inverter) along with an appropriate crystal may also be used to provide a reference source frequency. A fundamental mode crystal, parallel resonant at the desired operating frequency, should be connected to the OSC input and OSC output terminals.

The output fR of divide-by-R counter 34 is internally connected to one input of each of a phase detector A 50, a lock detector 52 and a phase detector B 54. This frequency output fR of divide-by-R counter 34 can be also used externally through a terminal labeled "fR".

The programming of the division ratio N in 16-bit divided-by-N counter 44 is carried out in essentially the same way as the programming of the division ratio R, except that an address of A1=high and A0=low should be used for selecting divide-by-N word register 40 and loading sixteen bit data in parallel to divide-by-N word register 40.

A sample frequency of frequency synthesizer 10 is typically derived from a loop VCO and AC-coupled into a terminal labeled "fin". The divide-by-N counter 44 receives the buffered sample frequency, counts the pulses of the sample frequency downward from its programmed division N to zero, and provides one output pulse (fV) at every N sample frequency pulses. Therefore, the frequency fV equals the sample frequency divided by N.

The output fV of divide-by-N counter 44 is internally connected to other inputs of each of phase detector A 50, lock detector 52 and phase detector B 54. This frequency output, fV, of divide-by-N counter 34 can be also used externally through a terminal fV.

Two input frequencies fR and fV are compared in phase detector 50 which may be a digital phase detector. Phase detector 50 provides three-state outputs which can be used as loop error signal in PLL. When frequency fV is greater than frequency fR or frequency fV is leading frequency fR, phase detector 50 provides negative pulses to a terminal PD. When frequency fV is less than frequency fR or frequency fV is lagging behind frequency fR, phase detector 50 provides positive pulses. When frequency fV equals fR and both phases coincide, the output of phase detector 50 is in a high impedance state.

Lock detector 52 provides a lock detector signal. The lock detector signal is essentially at a high level except for narrow pulses when the phase lock loop is locked, that is, frequencies fV and fR are of the same phase and same frequency. The lock detector signal is at a low level when the loop is out of lock.

Phase detector B, which is indicated by element 54, outputs another type of information consisting of the phase R signal and phase V signal which can be combined externally for a loop error signal. If frequency fV is greater than frequency fR or the phase of frequency fV is leading, then error information is provided by phase V pulsing low. Phase R remains essentially high. If frequency fV is less than frequency fR or the phase of frequency fV is lagging behind frequency fR, then error information is provided by phase R pulsing low. Phase V remains essentially high. If the frequency fV substantially equals frequency fR and both are in phase, then both phases V and R remain logically high except for a small minimum time period when both pulses are low in phase.

All of output terminals REF OUT, fR, fV, LD, PD, PHASE R and PHASE V are always providing their outputs. These frequency outputs generate undesirable electromagnetic interference (EMI) and radio frequency electromagnetic interference (RFI) as mentioned above.

Figure 2:
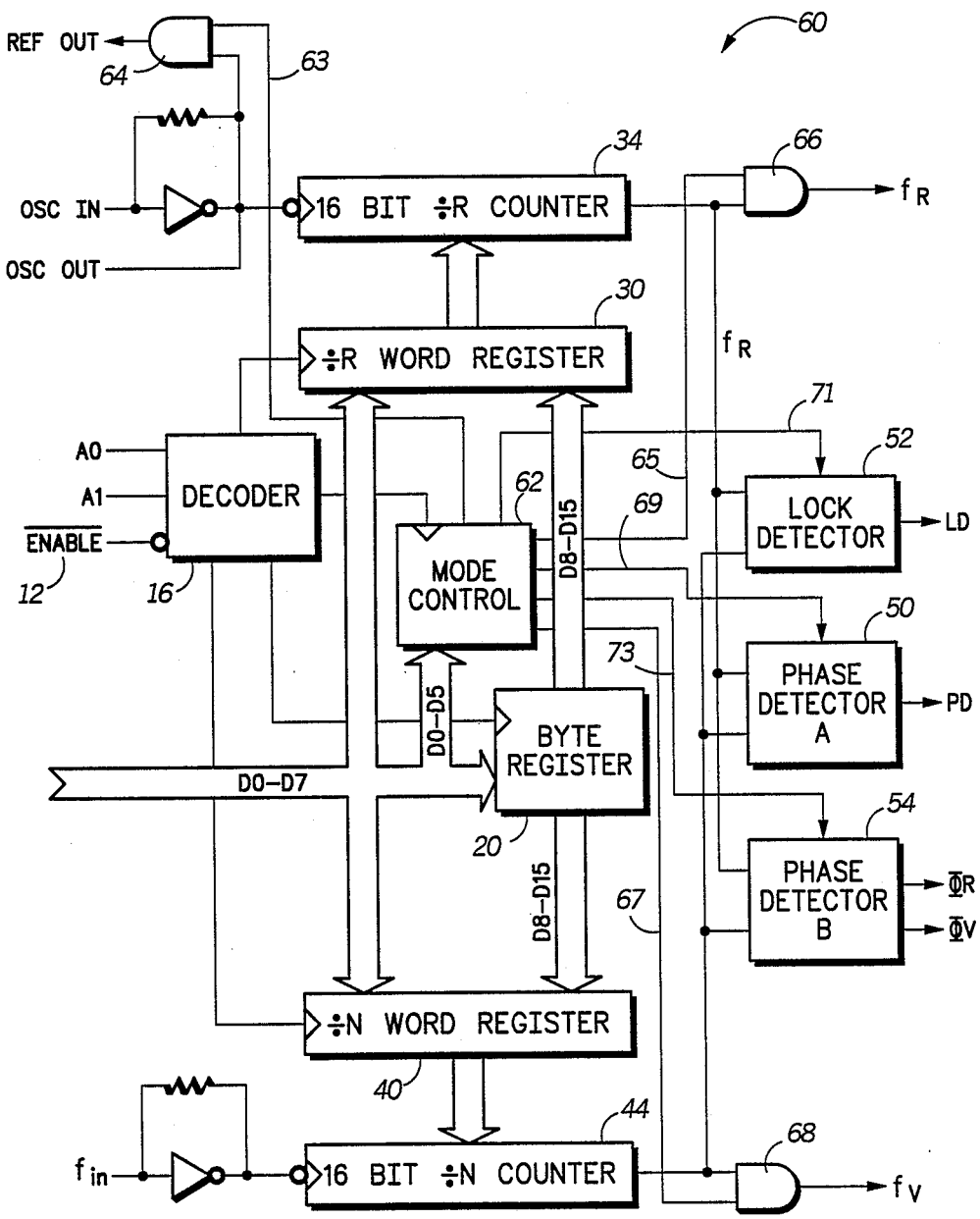
FIG. 2 is a block diagram of one embodiment PLL frequency synthesizer IC chip according to the present invention.

The PLL frequency synthesizer IC chip according to the present invention will now be described in detail with reference to a preferred embodiment thereof, which is illustrated in FIG. 2. Similar reference numerals indicate similar elements as in FIG. 1.

As shown in a block diagram in FIG. 2, this preferred embodiment of the frequency synthesizer IC chip 60 additionally includes mode control logic 62, AND gates 64, 66 and 68, and some control lines, such as 69, 71 and 73.

Mode control data is supplied onto inputs D0 through D5 preferably under control of a microcomputer or microprocessor. Then, the data on inputs D0 through D5 are loaded into mode control logic 62 by strobing the ENABLE signal with address line A1 equal to address line A0 and at a logic high value. Depending upon the value of loaded data, mode control 62 outputs control signals which control the output devices.

More specifically, the reference frequency supplied by the oscillator is transmitted through AND gate 64 and sent out of the IC chip. AND gate 64 is controlled by mode control logic 62 via control line 63. In other words, mode control logic 62 controls whether the reference frequency should be outputted to the terminal REF OUT or not.

Also the output fR of divide-by-R counter 34 is sent out of the IC chip through AND gate 66 which is controlled by mode control logic 62 via control line 65. Similarly, AND gate 68, phase detector A 50, lock detector 52 and phase detector B 54 are controlled by mode control logic 62 via control lines 67, 69, 71 and 73, respectively.

Accordingly, mode control logic 62 can shut off those outputs fV, PD, LD, PHASE R and PHASE V. Mode control logic 62 may turn off or on all six output devices 64, 66, 52, 50, 54 and 68 independently. In that case, mode control need to be supplied with six-bit data. Alternatively, mode control logic 62 can select some combination of turning off/on of some devices, in that case less than six-bit data is enough. For example, the level of the mode control data on output D1 may independently provide fR output active/inactive control. The level of the mode control data on D2 may independently provide fV output active/inactive control. The level of the mode control data on D3 may independently provide REFOUT active/inactive control. The level of D4 may independently provide PDout active/inactive control. It should be understood by those skill in the art that any kind of control signals and any combinations thereof is posible without departing from the scope of the present invention.

The PLL frequency synthesizer IC chip according to the present invention can easily turn on or off any output devices independently to minimize noise. Therefore, according to the present invention one generic IC chip can be used for many applications by mode-programming without EMI or RFI trouble. There is no longer a need to provide a variety of different chips for a variety of applications.

By now it should be apparent that there has been provided a PLL frequency synthesizer in which the frequency synthesizer generates phase advance and phase retard signals based on comparison between a reference frequency and sample frequency fed back from a voltage controlled oscillator. As a result, system design constraints are eased by the ability to shut off unused outputs to minimize noise.

While the invention has been shown and described with reference to a particular embodiment thereof in terms of eight-bit data inputs being presently mainstream, it will be apparent to those of ordinary skill in the art that other bit numbers may also be used and that the invention may be applied to a wide variety of frequency synthesizers having a plurality of outputs. The present invention may be applied to serial input PLL frequency synthesizer. Accordingly, it is intended to encompass in the claims that follow, all such variations and changes falling within the scope of the invention.

We claim:

1. In a PLL frequency synthesizer IC chip having a sample frequency input terminal, data and address lines and a plurality of different output devices, a mode control circuit for turning off any selected ones of the plurality of different output devices, said mode control circuit comprising:

first means having a plurality of inputs connected to at least one of the data and address lines, said first means determining different modes of operation of the PLL frequency synthesizer IC chip; and second means having a plurality of outputs connected to the plurality of different output devices for selecting ones of the plurality of different output devices to allow outputting therefrom and for shutting off outputs from all of the remaining different output devices, based on the determined mode of operation.

2. In a PLL frequency synthesizer IC chip, a mode control circuit according to claim 1, wherein said frequency synthesizer IC chip is a parallel input frequency synthesizer IC chip.

3. In a PLL frequency synthesizer IC chip, a mode control circuit according to claim 1, wherein said frequency synthesizer IC chip is a serial input frequency synthesizer IC chip.

4. In a PLL frequency synthesizer IC chip, a mode control circuit according to claim 1, wherein said IC chip is coupled to a voltage controlled oscillator through the sample frequency input terminal, and further comprises:

reference frequency counting means for counting a reference frequency divided by a first number;

sample frequency counting means coupled to the sample frequency input terminal for counting a sample frequency which is fed back from the voltage controlled oscillator and divided by a second number; and phase detecting means coupled to the reference frequency counting means and to the sample frequency counting means for comparing the count of the divided reference frequency and the count of the divided sample frequency, and providing an error signal based on the comparison.

* * * * *